United States Patent
Yip (10) Patent No.: US 7,580,286 B2
(45) Date of Patent: Aug. 25, 2009

(54) SELECTIVE THRESHOLD VOLTAGE VERIFICATION AND COMPACTION

(75) Inventor: Aaron Yip, Santa Clara, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/042,021

(22) Filed: Mar. 4, 2008

(65) Prior Publication Data

US 2008/0151638 A1 Jun. 26, 2008

Related U.S. Application Data

(62) Division of application No. 11/216,742, filed on Aug. 31, 2005, now Pat. No. 7,345,918.

(51) Int. Cl.
G11C 11/34 (2006.01)

(52) U.S. Cl. ............... 365/185.17; 365/185.18; 365/185.22; 365/185.24; 365/185.29; 365/185.33

(58) Field of Classification Search ............ 365/185.11, 365/185.17, 185.18, 185.22, 185.24, 185.29, 365/185.3, 185.33
See application file for complete search history.

(56) References Cited

U.S. PATENT DOCUMENTS

| 5,122,985 A | 6/1992 | Santin |
| 5,163,021 A | 11/1992 | Mehrotra et al. |
| 5,172,338 A | 12/1992 | Mehrotra et al. |
| 5,237,535 A | 8/1993 | Mielke et al. |
| 5,313,421 A | 5/1994 | Guterman et al. |
| 5,359,558 A | 10/1994 | Chang et al. |
| 5,400,286 A | 3/1995 | Chu et al. |
| 5,467,306 A | 11/1995 | Kaya et al. |
| 5,619,454 A | 4/1997 | Lee et al. |
| 5,671,299 A | 9/1997 | Oshida |
| 5,732,019 A | 3/1998 | Urai |
| 5,909,397 A | 6/1999 | San et al. |
| 5,936,971 A | 8/1999 | Harari et al. |
| 6,222,762 B1 | 4/2001 | Guterman et al. |
| 6,317,364 B1 | 11/2001 | Guterman et al. |
| 6,426,898 B1 | 7/2002 | Mihnea et al. |
| 6,438,037 B1 | 8/2002 | Fastow et al. |
| 6,493,280 B2 | 12/2002 | Mihnea et al. |
| 6,563,741 B2 | 5/2003 | Mihnea et al. |
| 6,952,368 B2 * | 10/2005 | Miura et al. ........... 365/185.11 |
| 6,975,537 B2 | 12/2005 | Lutze et al. |
| 7,006,379 B2 | 2/2006 | Noguchi et al. |
| 7,020,017 B2 | 3/2006 | Chen et al. |
| 7,088,621 B2 | 8/2006 | Guterman et al. |
| 7,161,833 B2 | 1/2007 | Hemink |
| 7,366,020 B2 * | 4/2008 | Choi ..................... 365/185.17 |

* cited by examiner

*Primary Examiner*—Trong Phan
(74) *Attorney, Agent, or Firm*—Leffert Jay & Polglaze, P.A.

(57) ABSTRACT

Non-volatile memory devices for providing selective compaction verification and/or selective compaction to facilitate a tightening of the distribution of threshold voltages in memory devices utilizing a NAND architecture. By providing for compaction verification and/or compaction on less than all word lines of a NAND string, increased tightening of the distribution may be achieved over prior methods performed concurrently on all word lines of a NAND string.

20 Claims, 6 Drawing Sheets

SELECTIVE THRESHOLD VOLTAGE VERIFICATION AND COMPACTION

This application is a divisional of U.S. patent application Ser. No. 11/216,742 (now U.S. Pat. No. 7,345,918), filed Aug. 31, 2005 and titled "SELECTIVE THRESHOLD VOLTAGE VERIFICATION AND COMPACTION," which is commonly assigned and incorporated by reference in its entirety herein.

TECHNICAL FIELD OF THE INVENTION

The present invention relates generally to semiconductor memory devices, and in particular, the present invention relates to verification and compaction of erase threshold voltages in NAND architecture memory devices.

BACKGROUND OF THE INVENTION

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Changes in threshold voltage of the cells, through programming of charge storage or trapping layers or other physical phenomena, determine the data value of each cell. Common uses for flash memory include personal computers, personal digital assistants (PDAs), digital cameras, digital media players, cellular telephones and removable memory modules.

Flash memory typically utilizes one of two basic architectures known as NOR flash and NAND flash. The designation is derived from the logic used to read the devices. In NOR flash architecture, a column of memory cells are coupled in parallel with each memory cell coupled to a bit line. In NAND flash architecture, a column of memory cells are coupled in series with only the first memory cell of the column coupled to a bit line.

One common undesirable phenomenon in NAND technology is referred to as FG-FG coupling, wherein a threshold voltage (Vt) of a memory cell is shifted undesirably as a result of neighboring cells' threshold voltages being shifted during programming. The more negative the initial Vt of a memory cell, the more prone it is to such shifts.

To address FG-FG coupling concerns, memory arrays are often compacted, that is, an attempt is made to tighten the Vt distribution. Such compaction is performed by applying soft programming pulses to all word lines and all un-inhibited bit lines. The voltage applied to the word lines is generally lower than a normal program voltage. The voltage applied to the bit lines is generally near a ground level. Each soft-program pulse is preceded by a verify to determine if any cell within a NAND string has increased to some predetermined value, such as a maximum desired value of an erase Vt in the case of an n-type cell. If so, that string is inhibited from further pulses as further programming pulses may result in programming one or more cells.

This compaction is followed by a verify operation. The verify operation may be performed as an inverted read of the string. The bit lines may be precharged to ground and pulled up through the string. The bit line voltage achieved is a function of the word line voltage and the string's maximum core cell Vt. If the bit line voltage is too high, it means the maximum Vt is too low and the string requires additional soft-program pulses. If the bit line voltage is low enough, the string is inhibited from further pulses. It is important to note that within the string, there are cells whose threshold voltages are more negative than the maximum in that compaction is halted as soon as any cell in the string reaches the predetermined threshold voltage. This can leave many cells having threshold voltages that are far from the desired Vt level.

Figure 5:
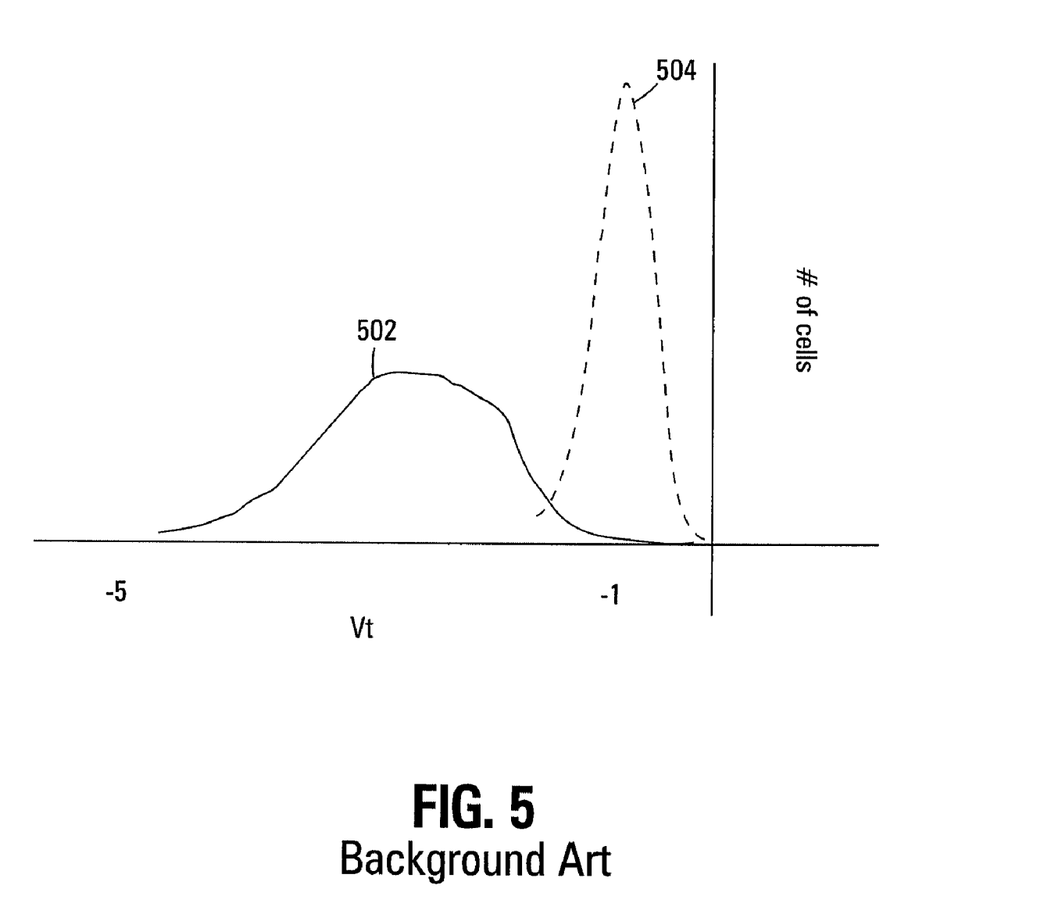
FIG. 5 is a graph of hypothetical threshold voltage distributions.

FIG. 5 is a graph of a hypothetical threshold voltage distribution 502 as might be representative of variations in threshold voltages following erasure of a portion of a memory array. To mitigate the effects of FG-FG coupling, it would be more desirable to have a threshold voltage distribution of the type depicted as dashed line 504. However, a distribution of the type depicted as dashed line 504 is generally not attainable if a individual strings of memory cells each contain a wide distribution of threshold voltages.

For the reasons stated above, and for other reasons stated below which will become apparent to those skilled in the art upon reading and understanding the present specification, there is a need in the art for alternative methods of performing compaction and apparatus for performing such methods.

DETAILED DESCRIPTION OF THE INVENTION

In the following detailed description of the present embodiments, reference is made to the accompanying drawings that form a part hereof, and in which is shown by way of illustration specific embodiments in which the inventions may be practiced. These embodiments are described in sufficient detail to enable those skilled in the art to practice the invention, and it is to be understood that other embodiments may be utilized and that process, electrical or mechanical changes may be made without departing from the scope of the present invention. The terms wafer and substrate used previously and in the following description include any base semiconductor structure. Both are to be understood as including silicon-on-sapphire (SOS) technology, silicon-on-insulator (SOI) technology, thin film transistor (TFT) technology, doped and undoped semiconductors, epitaxial layers of silicon supported by a base semiconductor, as well as other semiconductor structures well known to one skilled in the art. Furthermore, when reference is made to a wafer or substrate in the following description, previous process steps may have been utilized to form regions/junctions in the base semiconductor structure. The following detailed description is, therefore, not to be taken in a limiting sense, and the scope of the present invention is defined only by the appended claims and equivalents thereof.

As noted above, memory cells in NAND strings can experience threshold voltage shifts during programming of one or more neighboring memory cells. The more negative the initial Vt of a memory cell, the more prone it is to such shifts. Upon erasure of a portion of a memory array, memory cells will generally have some distribution of threshold voltages. The distribution is a result of variations in physical properties of the memory cells caused by a cell's placement within the array, differences in doping levels, line thickness, etc. The various embodiments address the issue of variations within a memory cell string by providing for bit-wise compaction of threshold voltages.

Figure 1:
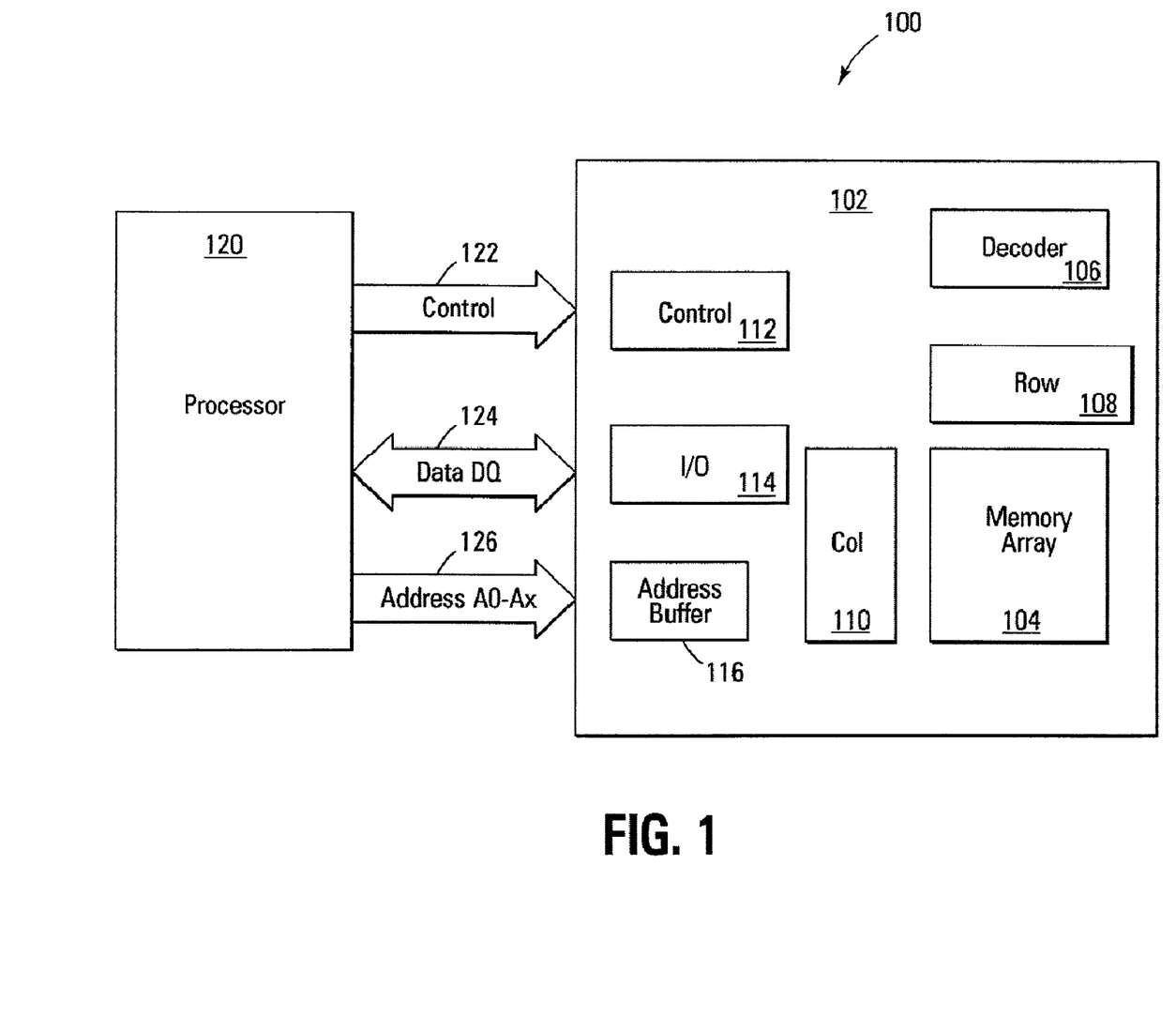
FIG. 1 is a functional block diagram of a electronic system having at least one memory device in accordance with an embodiment of the invention.

FIG. 1 is a simplified block diagram of an electronic system 100, according to an embodiment of the invention. Electronic system 100 includes a non-volatile memory device 102 that includes an array of non-volatile memory cells 104, an address decoder 106, row access circuitry 108, column access circuitry 110, control circuitry 112, Input/Output (I/O) circuitry 114, and an address buffer 116. The control circuitry 112 is adapted to perform methods in accordance with embodiments of the invention. The memory cells (not shown in FIG. 1) of the array of non-volatile memory cells 104 may be floating-gate memory cells or floating-node memory cells.

Electronic system 100 includes an external processor 120, e.g., a memory controller or host processor, electrically connected to memory device 102 for memory accessing. The memory device 102 receives control signals from the processor 120 over a control link 122. The memory cells are used to store data that are accessed via a data (DQ) link 124. Address signals are received via an address link 126 that are decoded at address decoder 106 to access the memory array 104. Address buffer circuit 116 latches the address signals. The memory cells are accessed in response to the control signals and the address signals. The control link 122, data link 124 and address link 126 can be collectively referred to as access lines. It will be appreciated by those skilled in the art that additional circuitry and control signals can be provided, and that the memory device of FIG. 1 has been simplified to help focus on the invention.

Figure 2A:
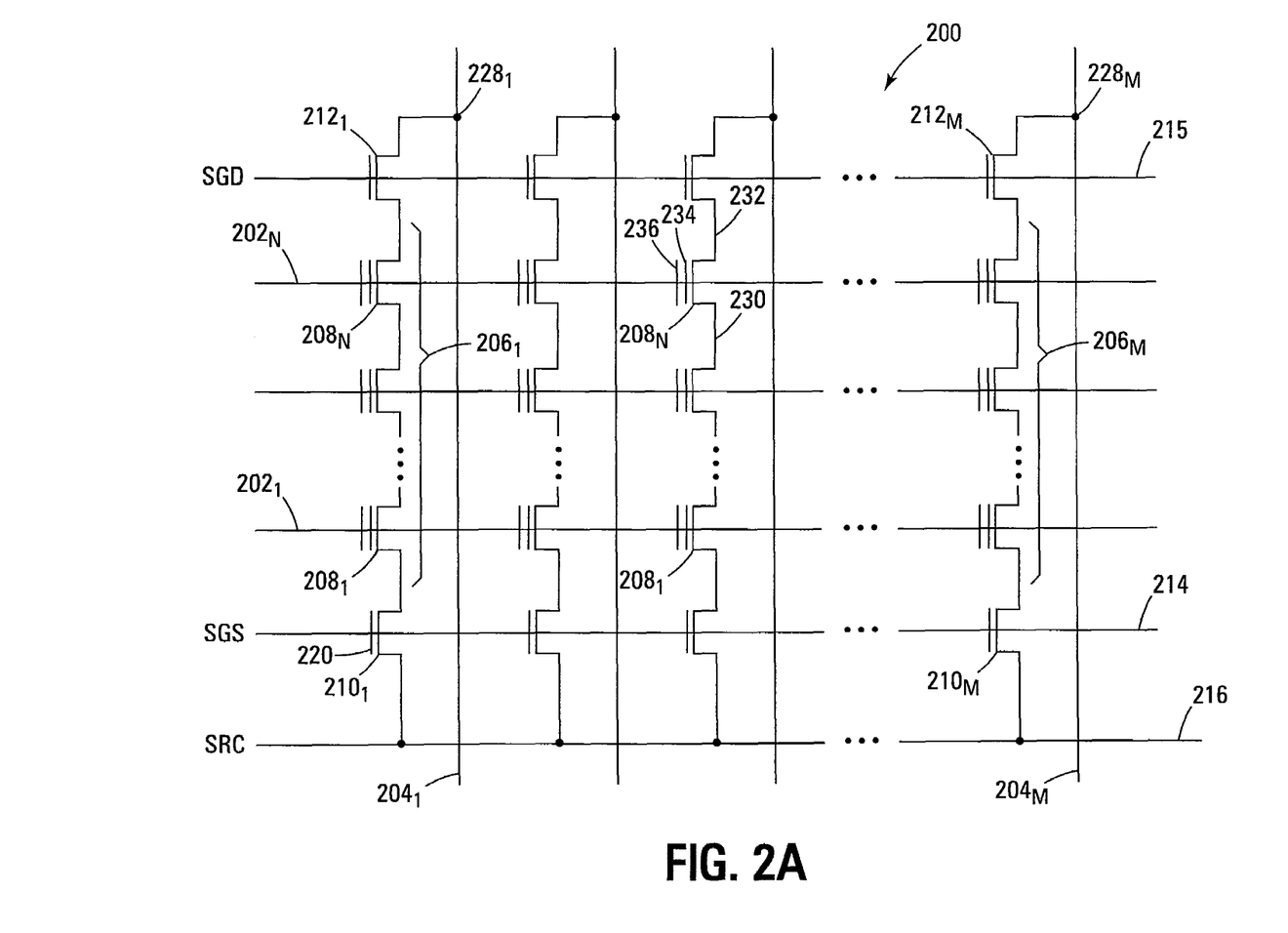
FIGS. 2A-2B are schematics of a portion of a NAND memory array in accordance with an embodiment of the invention.

FIG. 2A is a schematic of a NAND memory array 200 as a portion of memory array 104 of FIG. 1 in accordance with a further embodiment of the invention. As shown in FIG. 2, the memory array 200 includes word lines $202_1$ to $202_N$ and intersecting local bit lines $204_1$ to $204_M$. For ease of addressing in the digital environment, the number of word lines 202 and the number of bit lines 204 are each some power of two, e.g., 256 word lines 202 by 4,096 bit lines 204.

Memory array 200 includes NAND strings $206_1$ to $206_M$. Each NAND string includes floating-gate transistors $208_1$ to $208_N$, each located at an intersection of a word line 202 and a local bit line 204. The floating-gate transistors 208 represent non-volatile memory cells for storage of data. The floating-gate transistors 208 of each NAND string 206 are connected in series source to drain between a source select gate 210, e.g., a field-effect transistor (FET), and a drain select gate 212, e.g., an FET. Each source select gate 210 is located at an intersection of a local bit line 204 and a source select line 214, while each drain select gate 212 is located at an intersection of a local bit line 204 and a drain select line 215 (SGD).

A source of each source select gate 210 is connected to a common source line 216 (SRC), i.e., source select gates $210_1$-$210_M$ are each connected to the same source line 216. The drain of each source select gate 210 is connected to the source of the first floating-gate transistor 208 of the corresponding NAND string 206. For example, the drain of source select gate $210_1$ is connected to the source of floating-gate transistor $208_1$ of the corresponding NAND string $206_1$. A control gate 220 of each source select gate 210 is connected to source select line 214 (SGS).

The drain of each drain select gate 212 is connected to a local bit line 204 for the corresponding NAND string at a drain contact 228. For example, the drain of drain select gate $212_1$ is connected to the local bit line $204_1$ for the corresponding NAND string $206_1$ at drain contact $228_1$ while the drain of drain select gate $212_M$ is connected to the local bit line $204_M$ for the corresponding NAND string $206_M$ at drain contact $228_M$. The source of each drain select gate 212 is connected to the drain of the last floating-gate transistor 208 of the corresponding NAND string 206. For example, the source of drain select gate $212_1$ is connected to the drain of floating-gate transistor $208_N$ of the corresponding NAND string $206_1$.

Typical construction of floating-gate transistors 208 includes a source 230 and a drain 232, a floating gate 234, and a control gate 236, as shown in FIG. 2. Floating-gate transistors 208 have their control gates 236 coupled to a word line 202. A column of the floating-gate transistors 208 are those NAND strings 206 coupled to a given local bit line 204. A row of the floating-gate transistors 208 are those transistors commonly coupled to a given word line 202.

Figure 2B:
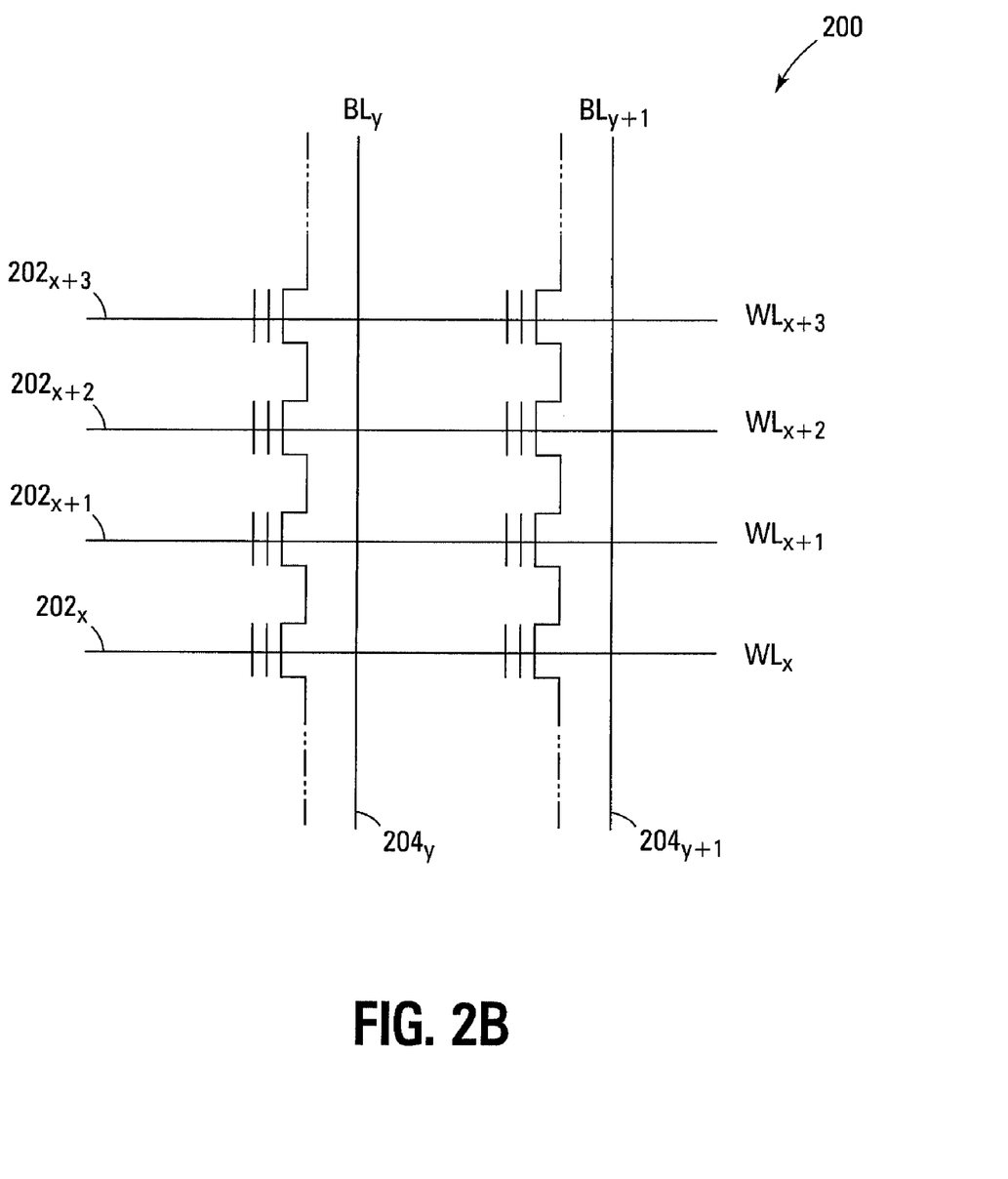

FIG. 2B is a portion of the memory array 200 of FIG. 2A. The word line $202_x$ may represent the first word line of a string 206, the last word line of the string 206 or some other word line of the string 206. Numbering of the word lines 202 in FIG. 2B is in relation to the order of programming and increasing numbers could be indicative of a word line closer to the drain select gate in the case of bottom-up programming or a word line closer to the source select gate in the case of top-down programming. The following description of compaction verify and compaction methods of various embodiments of the invention will refer to reference numbers of both figures.

As with prior compaction verify/compaction routines, a compaction verify operation may be performed to determine whether a compaction operation is desired. However, unlike prior compaction verify operations, the various embodiments allow for the exclusion of one or more word lines of the NAND string. That is, the compaction verify is selective within a string of memory cells. For one embodiment, the compaction verify operation verifies only one word line of a NAND string at a time, e.g., the word line to be programmed. For another embodiment, the compaction verify operation concurrently verifies a word line to be programmed and a word line next to be programmed. For a further embodiment, the compaction verify operation concurrently verifies a word line to be programmed and two or more word lines to be subsequently programmed. For a still further embodiment, the compaction verify operation concurrently verifies a word line to be programmed and each remaining word line of a NAND string to be subsequently programmed. It is noted that, in general, programming of a NAND string is performed from bottom up, i.e., from $WL_0$ to $WL_N$, in compliance with industry standards. Although the embodiments will be described using a bottom-up approach, it is noted that the embodiments would be similarly applicable to programming using a top-down approach. While an ordered approach is used for programming in either case, the initial programming may start on any word line of the string. For example, after erasing a block of memory cells, the first programming operation on a NAND string may be on a word line other than $WL_0$ or $WL_N$.

For another embodiment, the compaction verify and optional compaction operations are performed immediately prior to programming a cell. In this manner, the time required for the compaction verify and optional compaction operation may be transparent to a user of the memory device. In multi-level cell memory devices, i.e., where two or more bits of data are stored in a single non-volatile memory cell, programming operations for some data levels take more time than other data levels. The timing requirements of the device are thus limited by the operations taking the longest time. In typical floating-gate multi-level memory cells, the various data levels are defined by different ranges of threshold voltages. Programming operations for the lower-Vt data levels are generally faster than the programming operations for the higher-Vt data levels. However, the lower-Vt data levels generally are more likely to require compaction. Because the compaction verify and compaction may take less time than a difference between the programming speed and the timing requirement of the memory device, that compaction verify and compaction could be transparent to a user of the device.

To perform a compaction verify operation in accordance with an embodiment of the invention, the bit lines 204 are precharged to a potential level at or near a ground potential or Vss. The precharging need only be sufficiently low to be able to determine a level of voltage rise that would indicate that no compaction is required as described below. One or more word lines 202 receive a voltage on their control gates sufficient to operate their corresponding memory cells as pass gates. For example, if all memory cells of the string are expected to be erased, a read voltage Vread might be used that is sufficient to activate any cell having an erased threshold voltage, while if any of the memory cells of the string are expected to be programmed, a pass voltage Vpass might be used that is sufficient to activate a expected highest Vt of a programmed cell. Concurrently, one or more remaining word lines 202 receive a lower voltage, i.e., a verify voltage Vverify, on their control gates sufficient to activate their corresponding memory cells only if their threshold voltages are less than some target value, Vtarget. The source select gates 210 and drain select gates 212 receive voltages on their control gates sufficient to act as pass gates and the source line 216 is pulled up to some voltage greater than Vverify, such as Vcc or Vread. For a further embodiment, the source line 216 is pulled up to some voltage that exceeds Vverify by an amount greater than or equal to an absolute value of the target threshold voltage. In this manner, the bit lines 204 will be pulled up to some voltage that is a function of Vverify and the maximum Vt of a memory cell coupled to the bit line that is receiving Vverify on its control gate, i.e., Vverify-Vtarget.

With reference to FIG. 2B, to perform the compaction verify operation embodiment described in the preceding paragraph, if some word line $202_x$ is the only word line being compaction verified in accordance with an embodiment of the invention, it would receive the verify voltage Vverify on its control gate while all remaining word lines of the string of memory cells would receive voltages sufficient to operate as pass gates. Because FG-FG coupling effects are most prominent for adjacent memory cells in the same word line and adjacent cells in a next word line to be programmed, it may be desirable to concurrently verify a word line to be programmed and a next word line to be programmed. For such an embodiment, if word line $202_x$ is the word line to be programmed and word line $202_{x+1}$ is the next word line to be programmed, both could be verified concurrently by providing each of word lines $202_x$ and $202_{x+1}$ with the verify voltage Vverify and providing all remaining word lines of the string of memory cells with voltages sufficient to operate as pass gates. For a further embodiment, a word line $202_{x+1}$ may be the first word line to be programmed in a string of memory cells and a concurrent compaction verify might be desired on that word line and all word lines of the string of memory cells to be subsequently programmed. For such an embodiment, the verify voltage Vverify would be provided to word lines $202_{x+1}$, $202_{x+2}$, $202_{x+3}$ and any remaining word lines between $202_{x+3}$ and the drain select gate 212 (or source select gate 210 in the case of top-down programming). Word line $202_x$ and any remaining word lines between word line $202_x$ and the source select gate 210 (or drain select gate 212 in the case of top-down programming) would receive sufficient voltages to act as pass gates.

Following a compaction verify operation, a compaction operation may be performed on those strings of memory cells where the compaction verify has indicated that no threshold voltage of those cells being verified is at or above the target value. As with the compaction verify operation, compaction operations in accordance with embodiments of the invention are selective within a string of memory cells.

To perform a compaction operation in accordance with an embodiment of the invention, the bit lines 204 for NAND strings 206 requiring compaction are pulled down to a first potential at or near a ground potential while remaining bit lines 204 for NAND strings 206 not requiring compaction are pulled up to some second potential sufficient to inhibit programming. One or more word lines 202 not being compacted receive a voltage on their control gates sufficient to operate their corresponding memory cells as pass gates, such as a pass voltage Vpass. Concurrently, one or more remaining word lines 202 being compacted receive a higher voltage, i.e., a soft program voltage Vspgm, on their control gates. The source select gates 210 are deactivated, such as be receiving the ground potential Vss on their control gates while the source line 216 is pulled up to some voltage, such as Vcc, to inhibit leakage. The drain select gates 212 receive voltages on their control gates sufficient to act as pass gates, such as Vcc. Absolute voltage levels will be dependent upon the design of memory cells, but the voltages should be chosen such that compaction is performed on those memory cells whose word line 202 receives the soft program voltage Vspgm and whose bit line 204 receives the first potential and such that compaction is inhibited on those memory cells whose word line 202 receives the pass voltage Vpass or whose bit line 204 receives the second potential.

With reference to FIG. 2B, to perform the compaction operation embodiment described in the preceding paragraph, if some word line $202_x$ is the only word line being compacted in accordance with an embodiment of the invention, it would receive the soft program voltage Vspgm on its control gate while all remaining word lines of the string of memory cells would receive voltages sufficient to operate as pass gates. If some word line $202_x$ ($WL_x$) is to be programmed and word line $202_{x+1}$ ($WL_{x+1}$) is the next word line to be programmed, and both are to be concurrently compacted, the soft program voltage Vspgm would be supplied to the control gates of each of word lines $202_x$ and $202_{x+1}$ with all remaining word lines of the string of memory cells being supplied with voltages sufficient to operate as pass gates. For a further embodiment, a word line $202_{x+1}$ may be the first word line to be programmed in a string of memory cells and a concurrent compaction might be desired on that word line and all word lines of the string of memory cells to be subsequently programmed. For such an embodiment, the soft program voltage would be provided to word lines $202_{x+1}$, $202_{x+2}$ ($WL_{x+2}$), $202_{x+3}$ ($WL_{x+3}$) and any remaining word lines between $202_{x+4}$ and the drain select gate 212 (or source select gate 210 in the case of top-down programming). Word line $202_x$ and any remaining word lines between word line $202_x$ and the source select gate 210 (or drain select gate 212 in the case of top-down programming) would receive sufficient voltages to act as pass gates. In each of these embodiments, if one or more memory cells on bit line $204_y$ ($BL_y$) were to be compacted, that bit line would receive the first potential to allow soft programming, and if no memory cell on bit line $204_{y+1}$ ($BL_{y+1}$) were to be compacted, that bit line would receive the second potential to inhibit soft programming.

Figure 3:
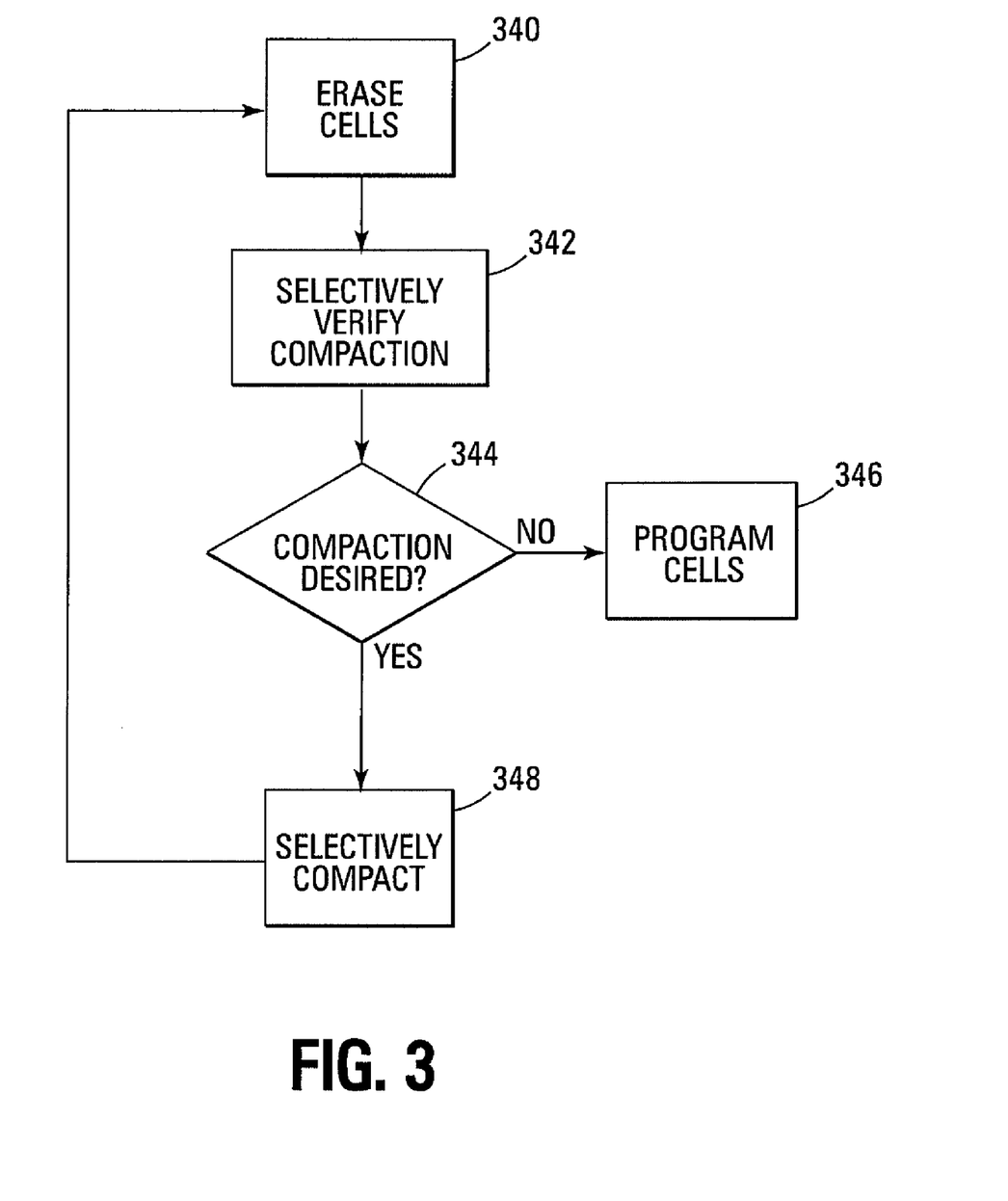
FIG. 3 is a flowchart of a method of verifying, compacting a programming a memory cell in accordance with an embodiment of the invention.

FIG. 3 is a flowchart of a method of verifying, compacting and programming a memory cell in accordance with an embodiment of the invention. In FIG. 3, the memory cells are erased at 340. Following erasure of the memory cells, a selective compaction verify operation is performed at 342.

The selective compaction verify is a verify operation performed on less than all of the memory cells of a given NAND string. For one embodiment, the selective compaction verify is performed on only one memory cell of the NAND string. For another embodiment, the selective compaction verify is performed on one memory cell of the NAND string and the next memory cell of the NAND string to be programmed. For a further embodiment, the selective compaction verify is performed on one memory cell of the NAND string and two or more memory cells of the NAND string to be subsequently programmed. For a still further embodiment, the two or more memory cells of the NAND string to be subsequently programmed include all of the remaining memory cells of the NAND string between the memory cell to be first programmed and an end of the NAND string. For one embodiment, the selective compaction verification is performed for each word line of the NAND string, but one word line at a time.

Following selective compaction verification at 342, a decision is made at 344 whether compaction is desired. Thus, if the selective compaction verification indicated that none of the verified memory cells had a threshold voltage equal to or greater than a target threshold voltage, it may be desirable to compact those cells. If no compaction is desired, programming of the desired memory cells occurs at 346. If compaction is desired, a selective compaction is performed at 348.

The selective compaction is a compaction operation performed on less than all of the memory cells of a given NAND string. For one embodiment, the selective compaction is performed on only one memory cell of the NAND string. For another embodiment, the selective compaction is performed on one memory cell of the NAND string and the next memory cell of the NAND string to be programmed. For a further embodiment, the selective compaction is performed on one memory cell of the NAND string and two or more memory cells of the NAND string to be subsequently programmed. For a still further embodiment, the two or more memory cells of the NAND string to be subsequently programmed include all of the remaining memory cells of the NAND string between the memory cell to be first programmed and an end of the NAND string. For one embodiment, the selective compaction would be performed on the same set of memory cells on which the selective compaction verify operation was performed. For a further embodiment, if the selection compaction verify operation was performed for each word line of the NAND string individually, the selection compaction operation could be performed on each word line on which compaction was indicated to be desired.

Figure 4:
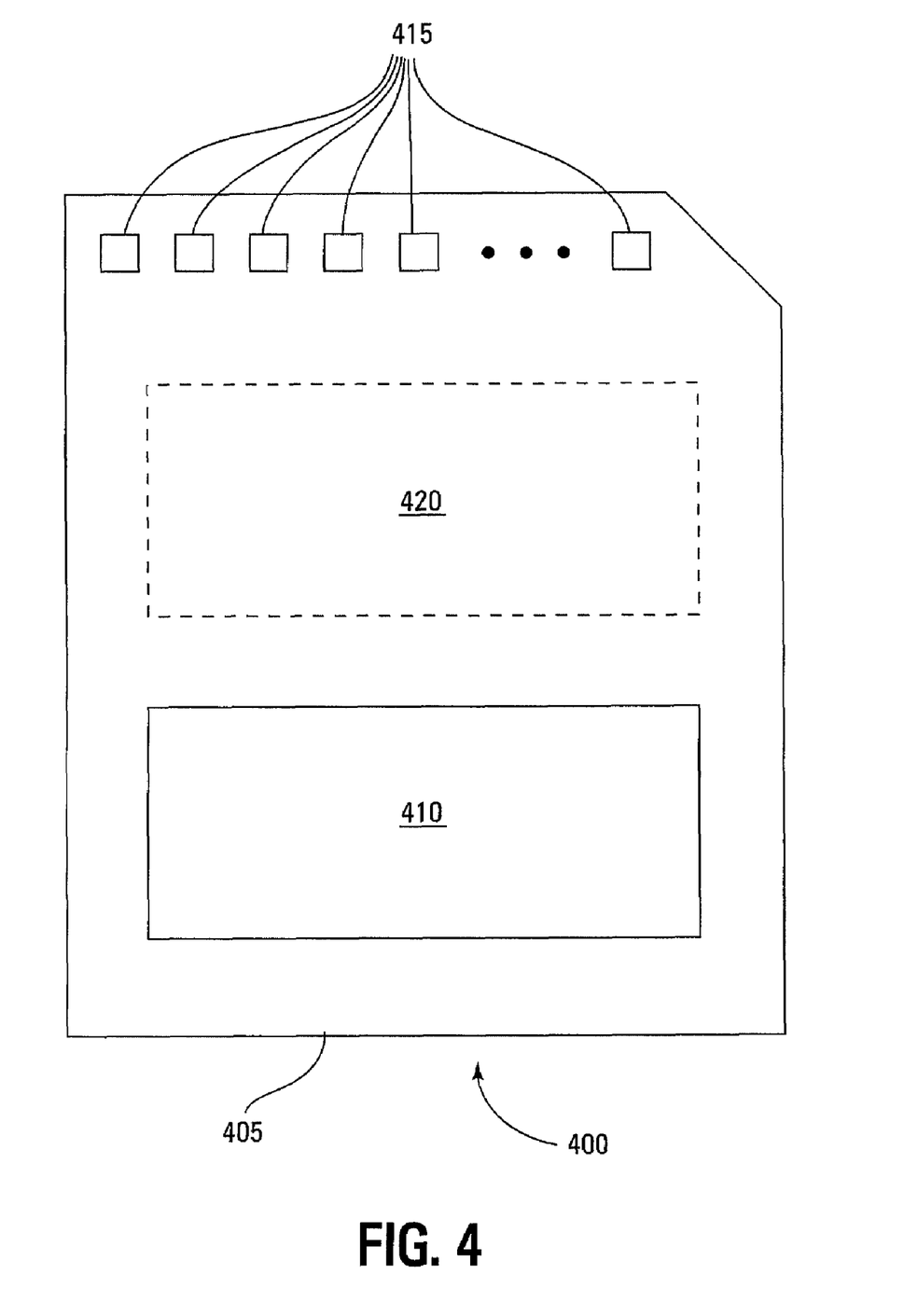
FIG. 4 is a functional block diagram of a memory module having at least one memory device in accordance with an embodiment of the invention.

FIG. 4 is an illustration of an exemplary memory module 400. Memory module 400 is illustrated as a memory card, although the concepts discussed with reference to memory module 400 are applicable to other types of removable or portable memory, e.g., USB flash drives, and are intended to be within the scope of "memory module" as used herein. In addition, although one example form factor is depicted in FIG. 4, these concepts are applicable to other form factors as well.

In some embodiments, memory module 400 will include a housing 405 (as depicted) to enclose one or more memory devices 410, though such a housing is not essential to all devices or device applications. At least one memory device 410 is a non-volatile memory having control circuitry adapted to perform selective compaction verification and/or selective compaction in accordance with embodiments of the invention. Where present, the housing 405 includes one or more contacts 415 for communication with a host device. Examples of host devices include digital cameras, digital recording and playback devices, PDAs, personal computers, memory card readers, interface hubs and the like. For some embodiments, the contacts 415 are in the form of a standardized interface. For example, with a USB flash drive, the contacts 415 might be in the form of a USB Type-A male connector. For some embodiments, the contacts 415 are in the form of a semi-proprietary interface, such as might be found on CompactFlash™ memory cards licensed by SanDisk Corporation, Memory Stick™ memory cards licensed by Sony Corporation, SD Secure Digital™ memory cards licensed by Toshiba Corporation and the like. In general, however, contacts 415 provide an interface for passing control, address and/or data signals between the memory module 400 and a host having compatible receptors for the contacts 415.

The memory module 400 may optionally include additional circuitry 420 which may be one or more integrated circuits and/or discrete components. For some embodiments, the additional circuitry 420 may include a memory controller for controlling access across multiple memory devices 410 and/or for providing a translation layer between an external host and a memory device 410. For example, there may not be a one-to-one correspondence between the number of contacts 415 and a number of I/O connections to the one or more memory devices 410. Thus, a memory controller could selectively couple an I/O connection (not shown in FIG. 4) of a memory device 410 to receive the appropriate signal at the appropriate I/O connection at the appropriate time or to provide the appropriate signal at the appropriate contact 415 at the appropriate time. Similarly, the communication protocol between a host and the memory module 400 may be different than what is required for access of a memory device 410. A memory controller could then translate the command sequences received from a host into the appropriate command sequences to achieve the desired access to the memory device 410. Such translation may further include changes in signal voltage levels in addition to command sequences.

The additional circuitry 420 may further include functionality unrelated to control of a memory device 410 such as logic functions as might be performed by an ASIC (application specific integrated circuit). Also, the additional circuitry 420 may include circuitry to restrict read or write access to the memory module 400, such as password protection, biometrics or the like. The additional circuitry 420 may include circuitry to indicate a status of the memory module 400. For example, the additional circuitry 420 may include functionality to determine whether power is being supplied to the memory module 400 and whether the memory module 400 is currently being accessed, and to display an indication of its status, such as a solid light while powered and a flashing light while being accessed. The additional circuitry 420 may further include passive devices, such as decoupling capacitors to help regulate power requirements within the memory module 400.

CONCLUSION

Non-volatile memory devices have been described for providing selective compaction verification and/or selective compaction to facilitate a tightening of the distribution of threshold voltages in memory devices utilizing a NAND architecture. By providing for compaction verification and/or compaction on less than all word lines of a NAND string, increased tightening of the distribution may be achieved over prior methods performed concurrently on all word lines of a NAND string.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method of operating a NAND architecture non-volatile memory device, comprising:

following an erasure of memory cells of the non-volatile memory device, performing a selective compaction verify operation on one or more, but less than all, word lines coupled to a first string of memory cells and determining whether a maximum threshold voltage of the memory cells of the first string of memory cells coupled to the one or more word lines is below a target threshold voltage; and if the maximum threshold voltage is determined to be below the target threshold voltage, performing a selective compaction operation on the one or more word lines;

wherein the selective compaction operation comprises applying a soft programming pulse to the one or more word lines; and wherein the soft programming pulse has a voltage that is less than a normal program voltage for the non-volatile memory device.

2. The method of claim 1, further comprising:

performing a subsequent selective compaction verify operation on the one or more word lines after performing the selective compaction operation.

3. The method of claim 1, wherein performing a selective compaction verify operation on one or more, but less than all, word lines comprises performing a selective compaction verify operation on a given word line coupled to the first string of memory cells and one or more other word lines coupled to the first string of memory cells that are coupled to memory cells of the first string of memory cells which are to be programmed subsequent to a memory cell of the first string of memory cells coupled to the given word line.

4. The method of claim 1, wherein performing a selective compaction verify operation on one or more, but less than all, word lines comprises performing a selective compaction verify operation on a given word line coupled to the first string of memory cells and each remaining word line coupled to the first string of memory cells that is coupled to a memory cell of the first string of memory cells which is to be programmed subsequent to a memory cell of the first string of memory cells coupled to the given word line.

5. The method of claim 1, wherein performing a selective compaction verify operation on one or more, but less than all, word lines comprises performing a selective compaction verify operation on only one word line.

6. The method of claim 5, further comprising:

repeating performing the selective compaction verify operation for each word line of the first string of memory cells.

7. The method of claim 6, wherein performing a selective compaction operation on the one or more word lines comprises performing a selective compaction operation on each word line for which a threshold voltage is determined to be below the target threshold voltage.

8. The method of claim 1, wherein performing a selective compaction operation on the one or more word lines comprises performing a selective compaction operation on the same set of word lines upon which the selective compaction verify operation was performed.

9. The method of claim 1, wherein performing a selective compaction operation on the one or more word lines comprises performing a selective compaction operation on a given word line coupled to the first string of memory cells and one or more other word lines coupled to the first string of memory cells that are coupled to memory cells of the first string of memory cells which are to be programmed subsequent to a memory cell of the first string of memory cells coupled to the given word line.

10. The method of claim 1, wherein performing a selective compaction operation on the one or more word lines comprises performing a selective compaction operation on a given word line coupled to the first string of memory cells and each remaining word line coupled to the first string of memory cells that is coupled to a memory cell of the first string of memory cells which is to be programmed subsequent to a memory cell of the first string of memory cells coupled to the given word line.

11. A memory device, comprising:

an array of non-volatile memory cells; and circuitry for control and/or access of the array of non-volatile memory cells;

wherein the array of non-volatile memory cells comprises at least one string of two or more series-coupled non-volatile memory cells; and wherein the circuitry for control and/or access of the array of non-volatile memory cells is adapted to perform a method, the method comprising:

following an erasure of memory cells of the memory device, performing a selective compaction verify operation on one or more, but less than all, word lines coupled to a first string of memory cells and determining whether a maximum threshold voltage of the memory cells of the first string of memory cells coupled to the one or more word lines is below a target threshold voltage; and if the maximum threshold voltage is determined to be below the target threshold voltage, performing a selective compaction operation on the one or more word lines;

wherein the selective compaction operation comprises applying a soft programming pulse to the one or more word lines; and wherein the soft programming pulse has a voltage that is less than a normal program voltage for the memory device.

12. The memory device of claim 11, wherein the method further comprises:
    performing a subsequent selective compaction verify operation on the one or more word lines after performing the selective compaction operation.

13. A memory module, comprising:
    a plurality of contacts; and
    one or more memory devices, each having access lines selectively coupled to the plurality of contacts;
    wherein at least one of the memory devices comprises:
        an array of non-volatile memory cells; and
        circuitry for control and/or access of the array of non-volatile memory cells;
        wherein the array of non-volatile memory cells comprises at least one string of two or more series-coupled non-volatile memory cells; and
        wherein the circuitry for control and/or access of the array of non-volatile memory cells is adapted to perform a method, the method comprising:
            following an erasure of memory cells of the at least one of the memory devices, performing a selective compaction verify operation on one or more, but less than all, word lines coupled to a first string of memory cells and determining whether a maximum threshold voltage of the memory cells of the first string of memory cells coupled to the one or more word lines is below a target threshold voltage; and
            if the maximum threshold voltage is determined to be below the target threshold voltage, performing a selective compaction operation on the one or more word lines;
            wherein the selective compaction operation comprises applying a soft programming pulse to the one or more word lines: and
            wherein the soft programming pulse has a voltage that is less than a normal program voltage for the at least one of the memory devices.

14. The memory module of claim 13, wherein the one or more memory devices are enclosed in a housing having the plurality of contacts.

15. The memory module of claim 13, wherein the memory module comprises at least two memory devices having access lines selectively coupled to the plurality of contacts without a housing.

16. An electronic system, comprising:
    A processor; and
        one or more memory device coupled to the processor, wherein at least one of the memory devices comprises:
            an array of non-volatile memory cells; and
            circuitry for control and/or access of the array of non-volatile memory cells;
            wherein the array of non-volatile memory cells comprises at least one string of two or more series-coupled non-volatile memory cells; and
            wherein the circuitry for control and/or access of the array of non-volatile memory cells is adapted to perform a method, the method comprising:
                following an erasure of memory cells of the at least one of the memory devices, performing a selective compaction verify operation on one or more, but less than all, word lines coupled to a first string of memory cells and determining whether a maximum threshold voltage of the memory cells of the first string of memory cells coupled to the one or more word lines is below a target threshold voltage; and
                if the maximum threshold voltage is determined to be below the target threshold voltage, performing a selective compaction operation on the one or more word lines:
                wherein the selective compaction operation comprises applying a soft programming pulse to the one or more word lines: and
                wherein the soft programming pulse has a voltage that is less than a normal program voltage for the at least one of the memory devices.

17. An electronic system, comprising:
    A processor; and
    one or more memory device coupled to the processor, wherein at least one of the memory devices comprises:
        an array of non-volatile memory cells; and
        circuitry for control and/or access of the array of non-volatile memory cells;
        wherein the array of non-volatile memory cells comprises at least one string of two or more series-coupled non-volatile memory cells; and
        wherein the circuitry for control and/or access of the array of non-volatile memory cells is adapted to perform a method, the method comprising:
            following an erasure of memory cells of the at least one of the memory devices, performing a selective compaction operation on one or more, but less than all, word lines coupled to a first string of memory cells to increase threshold voltages of memory cells of the first string of memory cells coupled to the one or more word lines and to inhibit an increase in threshold voltage for memory cells coupled to other word lines coupled to the first string of memory cells; and
            if the maximum threshold voltage is determined to be below the target threshold voltage, performing a selective compaction operation on the one or more word lines;
            wherein the selective compaction operation comprises applying a soft programming pulse to the one or more word lines; and
            wherein the soft programming pulse has a voltage that is less than a normal program voltage for the at least one of the memory devices.

18. The electronic system of claim 17, wherein, in the method, performing a selective compaction operation on one or more, but less than all, word lines comprises performing a selective compaction operation on two or more adjacent word lines.

19. The electronic system of claim 18, wherein, in the method, the two or more adjacent word lines further comprise a word line to be programmed and one or more word lines to be subsequently programmed.

20. The electronic system of claim 17, wherein, in the method performing a selective compaction operation on one or more, but less than all, word lines comprises performing a selective compaction operation in an order that is the same as an order for programming the word lines of the first string of memory cells.

* * * * *

UNITED STATES PATENT AND TRADEMARK OFFICE
CERTIFICATE OF CORRECTION

PATENT NO.        : 7,580,286 B2                                       Page 1 of 1
APPLICATION NO. : 12/042021
DATED             : August 25, 2009
INVENTOR(S)       : Aaron Yip It is certified that error appears in the above-identified patent and that said Letters Patent is hereby corrected as shown below:

In column 1, line 3, below title insert -- RELATED APPLICATIONS --.

In column 11, line 35, in Claim 13, delete "lines:" and insert -- lines; --, therefor.

In column 11, line 47, in Claim 16, delete "A" and insert -- a --, therefor.

In column 12, line 8, in Claim 16, delete "lines:" and insert -- lines; --, therefor.

In column 12, line 11, in Claim 16, delete "lines:" and insert -- lines; --, therefor.

In column 12, line 16, in Claim 17, delete "A" and insert -- a --, therefor.

Signed and Sealed this

Twentieth Day of October, 2009

David J. Kappos
*Director of the United States Patent and Trademark Office*